United States Patent
Cook et al.

(10) Patent No.: US 6,329,280 B1
(45) Date of Patent: Dec. 11, 2001

(54) INTERIM OXIDATION OF SILSESQUIOXANE DIELECTRIC FOR DUAL DAMASCENE PROCESS

(75) Inventors: Robert Cook, Minneapolis, MN (US); Stephen E. Greco, LaGrangeville, NY (US); John P. Hummel, Millbrook, NY (US); Joyce Liu, Hopewell Junction, NY (US); Vincent J. McGahay, Poughkeepsie, NY (US); Rebecca Mih; Kamalesh Srivastava, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/311,470

(22) Filed: May 13, 1999

(51) Int. Cl.[7] .............................................. H01L 21/4763
(52) U.S. Cl. ........................................... 438/623; 438/626
(58) Field of Search .................................... 438/618, 622, 438/623, 624, 637, 638, 694, 706, 710, 711, 712, 717, 743, 723, 725, 734, 737, 739

(56) References Cited

U.S. PATENT DOCUMENTS

| | | |
|---|---|---|
| 5,085,893 | 2/1992 | Weiss et al. . |
| 5,087,591 | 2/1992 | Teng . |
| 5,403,779 | 4/1995 | Joshi et al. . |
| 5,530,293 | 6/1996 | Cohen et al. . |
| 5,585,673 | 12/1996 | Joshi et al. . |
| 5,612,254 | 3/1997 | Mu et al. . |
| 5,635,423 * | 6/1997 | Huang et al. ........................ 438/624 |
| 5,656,543 | 8/1997 | Chung . |
| 5,661,344 | 8/1997 | Havemann et al. . |
| 5,668,054 | 9/1997 | Sun et al. . |
| 5,705,430 | 1/1998 | Avanzino et al. . |
| 5,714,418 | 2/1998 | Bai et al. . |
| 5,728,630 * | 3/1998 | Nishimura et al. .................. 438/763 |
| 5,750,403 | 5/1998 | Inoue et al. . |
| 5,753,967 | 5/1998 | Lin . |
| 5,818,111 | 10/1998 | Jeng et al. . |
| 5,821,162 | 10/1998 | Yamaha et al. . |
| 5,888,309 * | 3/1999 | Yu ....................................... 438/704 |
| 5,904,565 * | 5/1999 | Nguyen et al. ...................... 438/687 |
| 6,017,817 * | 1/2000 | Chung et al. ........................ 438/637 |
| 6,025,259 * | 2/2000 | Yu et al. .............................. 438/618 |
| 6,071,806 * | 6/2000 | Wu et al. ............................. 438/622 |
| 6,211,063 * | 4/2001 | Liu et al. ............................. 438/624 |
| 6,251,753 * | 6/2001 | Yeh et al. ............................ 438/445 |

* cited by examiner

Primary Examiner—Carl Whitehead, Jr.
Assistant Examiner—Jeff Vockrodt
(74) Attorney, Agent, or Firm—McGuireWoods, LLP; Joseph P. Abate

(57) ABSTRACT

Resist developers can attack some advanced dielectric materials such as silsesquioxane materials which can be used as an insulator between a surface of an integrated circuit chip and wiring layers formed on the surface of the dielectric material. By performing a resist stripping or etching process in which a reactant material is supplied externally or liberated from the dielectric material, an extremely thin surface protective covering of an intermediate material may be formed which is impervious to resist developers or any of a plurality of other materials which may damage the flowable oxide material. A dual Damascene process for forming robust connections and vias to the chip can thus be made compatible with advanced dielectrics having particularly low dielectric constants to minimize conductor capacitance and support fast signal propagation and noise immunity even where conductors are closely spaced to each other.

18 Claims, 2 Drawing Sheets

INTERIM OXIDATION OF SILSESQUIOXANE DIELECTRIC FOR DUAL DAMASCENE PROCESS

BACKGROUND OF THE INVENTION

1. Field of the Invention

The present invention generally relates to integrated circuit manufacturing processes and, more particularly, to processes for forming robust conductive structures on advanced insulating materials.

2. Description of the Prior Art

Increases in both performance and manufacturing economy with increased integration density have led to the use of design rules with extremely small feature sizes and closeness of spacing in integrated circuit design. Reduced interconnection length between devices included in integrated circuits generally reduces signal propagation time and increases noise immunity. However, as integrated circuits are scaled to smaller design rules, reductions in wiring delays are diminished by increases in resistance (due to decreased cross-sectional area) and capacitance (due to increased connection proximity). This effect can only be ameliorated by reduced resistivity of conductors and/or dielectric constant of insulators. Accordingly, advanced dielectric materials having low dielectric constants have been developed and used in manufacture of integrated circuits.

Among such advanced materials having particularly low dielectric constants now in widespread use are some silsesquioxane materials (hereinafter SSQ) which are particularly preferred for their ease of application, much in the nature of conventionally applied spin-on glass and gap filling qualities. The filling of gaps is important to reduce likelihood of propagation of crystal lattice dislocations and cracks in semiconductor materials which may carry significant internal stresses.

Suitable SSQ materials are commercially available polymer materials, one of which is principally, if not entirely, hydrogen silsesquioxane ($HSiO_{3/2}$), sometimes referred by the acronym HSSQ or HSQ. A related material sometimes employed is methyl silsesquioxane (MSSQ or MSQ) in which a methyl group is substituted for the hydrogen in HSQ. These materials form a structure in which bridging oxygen atoms are shared between molecules. While the dielectric constant is low, the bridging oxygen atoms are strained and can be attacked by numerous chemicals or result in rapidly propagating cracks from relatively minor physical damage. For that reason, unprotected SSQ materials are not generally considered suitable for formation of layers even though they exhibit good planarizing characteristics that would support high resolution lithographic processes. For example, U.S. Pat. No. 5,818,111 notes the relative fragility of HSQ and proposes a structure of alternating layers of HSQ and protective silicon dioxide to form a multi-layer dielectric stack.

Damascene processing, alluded to above, is a well-understood and mature technology which is particularly useful for mechanically forming robust connections of superior electrical integrity at very small sizes and close spacings. Basically, a Damascene process defines the desired shape of conductors by the formation of a groove or recess in the surface of a dielectric material followed by deposition of a layer of metal of sufficient thickness to fill the recesses. The layer of metal is then readily patterned by planarization to the original surface of the dielectric by any known process such as polishing. The structure so formed fully supports the metal at the bottom and sides of a connection (which may be made of materials such as gold, aluminum, tungsten or copper) and thus is resistant to metal migration, damage or the like. The formation of the groove or recess can also generally be formed with greater precision and regularity of the edges of the pattern than can be achieved by direct patterning of the layer of metal.

When forming conductors on a dielectric layer above a substantially completed chip, however, two patterning processes are required for formation of the interconnect patterns and for forming connections to devices on the chip in the form of vias alluded to above, respectively. These two patterning processes followed by metal deposition and planarization are collectively referred to as a dual Damascene process.

However, most SSQ materials are readily attacked by most lithographic resist developers which are generally of high pH. Moreover, when the SSQ material is attacked by resist developers, the amount of material which may be removed is not readily controllable and may undercut the resist pattern. Thus, when the SSQ is etched, even with a well-controlled etchant, the resulting via shape may be quite distorted and vias will lack uniformity across the chip and possibly be irregularly and unreliably registered with the structures on the chip to which the vias are to form connections.

Protection of the surface of the SSQ material with a further layer of material such as another dielectric is not practical in some semiconductor structures such as formation of connection vias in a dual Damascene process. Virtually any otherwise suitable material for protection of an SSQ material would have a dielectric constant which is higher than that of SSQ and even a very thin layer would increase capacitance at a location where capacitance may be critical and may possibly require a different etchant and/or an additional etching process to remove in accordance with a resist pattern. Additionally, while a protective layer may be deposited on an original surface of an SSQ layer deposition of a protective layer in an etched feature (e.g. in a trench or groove) would require additional process steps as well as compromising the low capacitance of any conductive structure formed therein for which the SSQ material was employed.

Of course, the concept of using a resist is predicated on the assumption that the underlying material will not be affected by the processing and development of the resist until the resist pattern is fully formed. Since the SSQ material removal by the resist developer appears to be a function of the breaking of fragile shared oxygen bonds, it is unlikely that a developer could be found which would not attack the SSQ material. Accordingly, at the present state of the art, processes using multiple resist layers would provide no significant benefit toward reduction of the problem.

In summary, use of HSQ or MSQ to underlie or support interconnection metallization allows use of dual Damascene processes to produce conductors and vias only with the likelihood that manufacturing yield will be compromised. While SSQ materials can be used as a gap fill material over connections applied to a surface, the advantages of damascene connections noted above are not achieved thereby. No technique has been available for avoiding the basic incompatibility of SSQ materials and resist developers in processes requiring a sequence of patterned etch steps, such as in a dual damascene process, particularly for accommodating fine pitch design rules for high density integrated circuits where the low dielectric constant of SSQ materials is particularly critical.

SUMMARY OF THE INVENTION

It is therefore an object of the present invention to provide a process for protection of SSQ dielectric materials from attack by developing solutions during resist patterning without deposition of an additional protective layer for that purpose in, for example, an etched feature where an initially provided protective film would have been removed.

It is another object of the invention to provide a process by which robust interconnections between devices on a chip can be formed by a dual Damascene process consistent with use of SSQ dielectric materials and high manufacturing yield.

It is a further object of the invention to provide a process of forming dual Damascene conductors of reduced cost.

It is yet another object of the invention to provide protection for a SSQ dielectric material during dual Damascene processing as an incident of other required steps to avoid additional process steps (and variation) and costs associated therewith.

In order to accomplish these and other objects of the invention, a method and semiconductor device formed thereby are provided by the steps of forming a pattern of resist on a surface of a material, removing a portion of the material in accordance with the pattern of resist while forming an intermediate material composition which is substantially impervious to a selected material at an exposed surface of the material as material is removed, forming a further pattern of resist on a surface of the intermediate material, and removing a portion of the intermediate material and a further portion of the material in accordance with the further pattern of resist.

In accordance with another aspect of the invention, a semiconductor device is provided including, in combination, a layer of silsesquioxane material, a damascene conductor formed in a groove in a surface of the silsesquioxane material, a via extending through the silsesquioxane material and located within said groove below the damascene conductor, and an oxidized surface on the silsesquioxane material within the groove.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
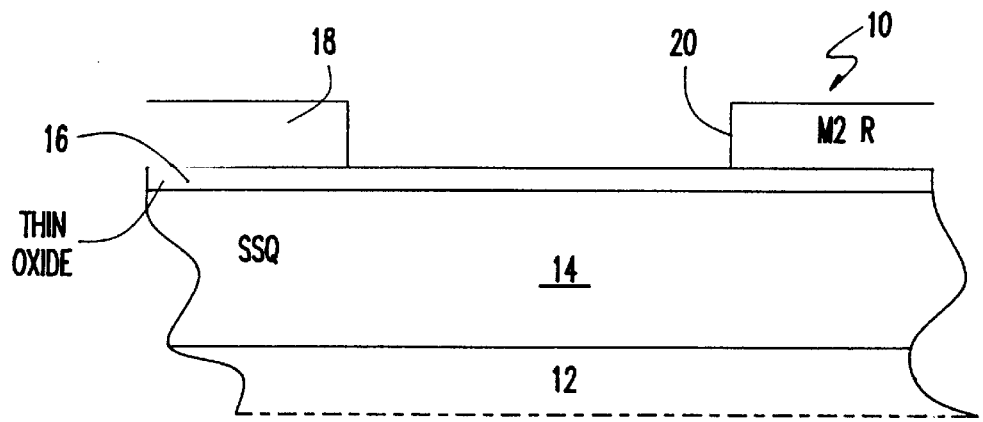
FIGS. 1 and 2 are cross-sectional views of initial stages of a dual Damascene process of a portion of an integrated circuit chip.
Figure 2:
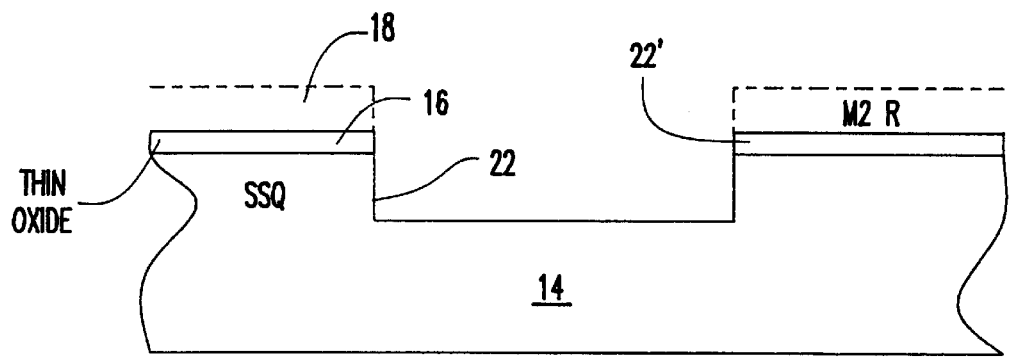
Figure 3:
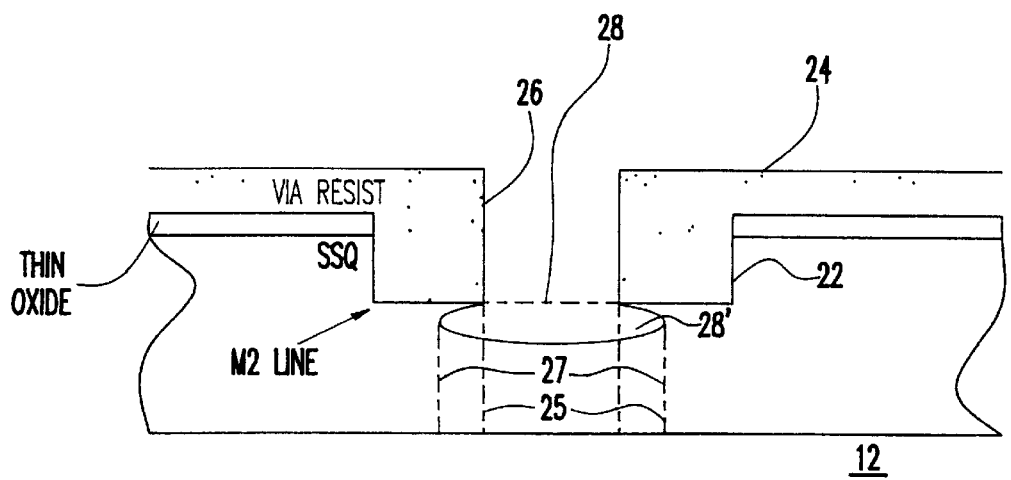
FIG. 3 is a cross-sectional view of via resist processing on a portion of an integrated circuit chip in a dual Damascene process illustrating effects of resist development without the present invention.

Referring now to the drawings, and more particularly to FIG. 1, there is shown in cross-section, an early stage in dual Damascene processing to produce conductors at a surface of structure 10 including an integrated circuit chip 12 having devices such as transistors, capacitors and underlying connections (not shown) formed thereon, an SSQ dielectric layer 14, a thin oxide dielectric layer 16 and a patterned resist layer 18. It should be understood that FIGS. 1–3 are not to scale and are disproportionately enlarged in some regions in the interest of clarity. It is also to be understood that while FIGS. 1 and 2 depict early stages of a well-understood dual Damascene process and FIG. 3 is illustrative of the effects of resist development in the absence of the invention, no portion of FIGS. 1–3 is admitted to be prior art as to the present invention.

The illustration of FIG. 1 assumes prior deposition, processing (e.g. drying), exposure and development of resist layer 18 to form an aperture 20 at the location of a connection to be formed. The resist and the metal layer illustrated, together with SSQ layer 14 and thin oxide layer 16 should be understood as being representative of any layer at any level and a plurality of such grouping of layers (e.g. 14 and 16) can be formed sequentially over other such layers and patterned in turn, at will, to develop desired connection patterns.

As shown in FIG. 1, development of the resist does not affect the SSQ layer 14 due to the protection provided by thin oxide layer 16. The thickness of the thin oxide is designed to cause minimal increase in capacitance in the final structure and can potentially be removed. However, it should be appreciated that the resist developer cannot attack the SSQ dielectric due to the presence of the thin oxide 16 which prevents the resist developer from reaching SSQ layer 14.

As shown in FIG. 2, an etching process is carried out to form an aperture 22' in thin oxide layer 16 and a recess 22 in SSQ layer 14 in accordance with the pattern 20 developed in resist 18. It should be noted that the etching process is reasonably well-behaved and anisotropic; following the patterning 20 of resist layer 18. Numerous processes providing results substantially as depicted are known in the art. The remainder of resist layer 18 can then be stripped away as depicted by dashed outlines of the profile thereof.

If only a conductor was to be formed by a single damascene process, a blanket metal layer could be deposited over all exposed surfaces and patterned by polishing, isotropic etching or the like to or through thin oxide layer 16 and no problem would arise. The problem addressed by the invention arises from the fact that portions of such a conductor must be connected to electronic structures on chip 12. The SSQ layer must thus be further patterned to form vias in order to do so when the metal blanket layer is deposited in accordance with a dual damascene process, as will now be explained with reference to FIG. 3. (Low resistance metals such as copper are not easily etched in a manner compatible with etching of SSQ materials and it would therefore be difficult to modify the dual damascene process to deposit the conductor to be used as a mask for the SSQ materials while forming the vias. The aspect ratio of the vias would also be increased by such a process, compromising the ability to fill the vias with metal.)

As shown in FIG. 3, another resist layer 24 is applied and exposed and developed to form pattern 26 which is intended to define the locations of vias which will be etched to reach structures formed on chip 12 in much the same manner as described above in connection with FIG. 2. However, the process of development of the resist progressively dissolves the resist into the developer and must be carried to completion to dissolve substantially all resist which is soluble in the developer in accordance with the patterning exposure.

Completion of the development process to properly form apertures 26 in the via resist 24 thus makes exposure of the surface 28 of the SSQ layer unavoidable (in the absence of the invention) for a somewhat extended period of time. As noted above, the developer can attack the SSQ material and does so isotropically. The developer thus removes material and forms a cavity or reacted zone that can extend under the resist and compromises both the integrity of the resist and the ability of the resist to properly control a subsequent etching process to form via 25 in the location and size intended.

That is, even a very well-controlled anisotropic etching process carried out after undercutting 28' of the via resist 24 had occurred, would be likely to form a via of the shape and location indicated at 27 rather than 25. As can be seen, via 27 is larger than intended, and is of irregular shape with its center shifted from that of via 25. Therefore, registration of the via with structures on chip 12 is compromised and, moreover, the increased size and potential error in location can cause shorting of structures on the chip.

Figure 4:
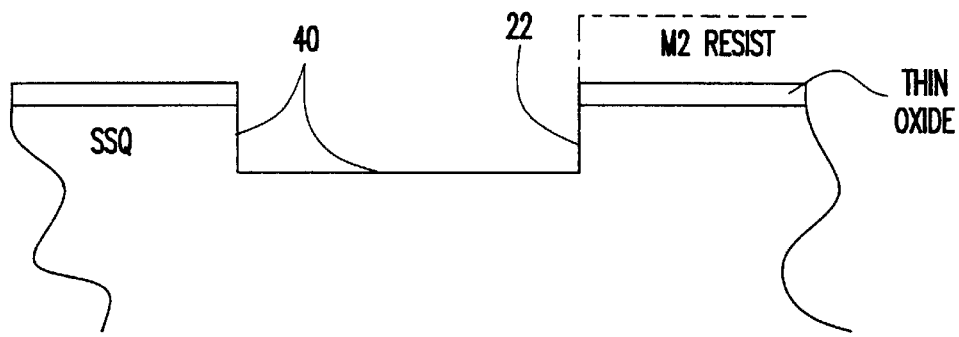
FIGS. 4 and 5 are cross-sectional views of a portion of an integrated circuit chip illustrating the practice of the invention and the protection of the SSQ dielectric achieved thereby.

Referring now to FIG. 4, the inventors have discovered that performing the etching described above with reference to FIG. 2 with certain preferred etchants and preferably using a reactive ion etching process, an extremely thin protective oxide film 40 can be provided on the surface of the SSQ material as it is exposed by the etching process. That is, an oxide-producing reaction is induced as part of the etching process which is self-limited to the exposed silicon atoms (and, possibly, silicon atom reachable by diffusion for a few hundred Angstroms ahead of the material being etched away) in the SSQ polymer.

This self-limited thickness of protective oxide is sufficiently small that the low dielectric constant of the SSQ material is not compromised significantly. The oxide can be reliably formed in a manner that protects the surface of the SSQ material due to the fact that it is a surface effect which involves all exposed silicon atoms. The etching of the oxide immediately following its formation further insures both the integrity of the protective oxide film and its self-limited thickness to a very small dimension only sufficient to its protective function. The protective oxide may thus be considered as an intermediate product of the etching process in accordance with the invention which is present only for an extremely short time and distance ahead of the surface at which material is removed.

While not wishing to be held to any particular theory of the chemical reaction or reactions which may occur during the practice of the invention, two etching processes suitable to the practice of the invention will now be described. These processes will serve as guidance to those skilled in the art in regard to the suitability of other etchants and etching processes for practice of the invention.

The processes which will now be described are believed to exploit the fact that SSQ materials HSQ ($HSiO_{3/2}$) and MSQ are deficient in oxygen relative to the stable silicon dioxide ($SiO_2$). This deficiency of oxygen is an incident of the polymeric nature of these materials and the processes described below are preferred techniques for supplying additional oxygen to take part in the chemical reaction to form $SiO_2$, which is the preferred protective film. However, it should be understood that the same basic principles would apply to dielectric materials based on other Group III–V semiconductor materials and protective films other than oxides, such as nitrides. However, other materials may increase the criticality of process parameters to obtain a suitable result.

In particular, the important factor in choice of processes, process parameters (e.g. reactant concentrations) and etchants is that the etching process must be suitable for both anisotropic etching of the SSQ material and the intermediate protective film material at substantially the same rate and which is similar to the diffusion rate of the reactant in the SSQ material at the chosen process temperature in order to maintain the thickness of the protective film 40 to a small dimension. In general, however, the processes which will be described below, including the preferred SSQ materials, are preferred, in large part, because the process parameters are not particularly critical.

In this regard, it has been found by the inventors that practice of the invention is much more easily controllable in a repeatable manner for HSQ than MSQ although similar results are readily obtained using either SSQ material. MSQ has been found to be much more reactive under conditions of the preferred processes and hence somewhat less controllable and more critical in regard to etching process time. Therefore, practice of the invention using HSQ is much preferred.

It should be appreciated however, that the preferred processes and alternatives thereto involve reaction(s) under conditions providing an excess of a reactant material which is concurrently removed by the etching process. That is, the reaction in accordance with the invention is substantially contrary to a process driven by relative concentration of materials at the surface being etched, as is often the case in etching processes. Therefore, the effects of the process in accordance with the invention is highly counter-intuitive and the meritorious effects thereof are unexpected.

Specifically, a first preferred process involves a resist strip using an oxygen-containing plasma which removes SSQ material as the pattern of resist remaining after development is removed. This process thus (externally) provides oxygen ions at the surface of the SSQ material as it is exposed and oxidizes the SSQ material for about 500 Angstroms below the exposed surface to form a very thin layer of $SiO_2$. A similar effect can be achieved in a second preferred process using a reactive ion etch containing fluorocarbons which is believed to liberate oxygen from the SSQ material as it is removed. Both processes form a film 40 of $SiO_2$ which is sufficient to provide cohesion protection (e.g. against the breaking of bonds to anisotropically remove material, avoidance of cracking, and other like forms of damage to the integrity of the polymeric structure) of the SSQ material due to the action of the developer since the oxide is substantially impervious to developers otherwise known to be suitable for lithographic processing of semiconductor materials.

Figure 5:
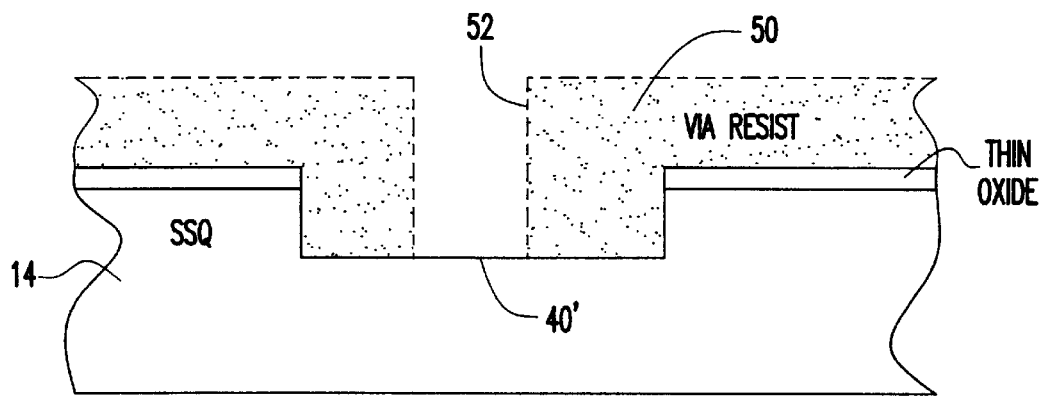

Thus, as shown in FIG. 5, when the via resist 50 is developed to form aperture 52, the SSQ material 14 is protected from the action of the developer in region 40' by the surface oxide formed by oxidation and without the addition of a further layer or requiring process steps to do so. The via pattern can thus be established by completion of patterning of the resist while completely avoiding any effect on the SSQ material.

Figure 6:
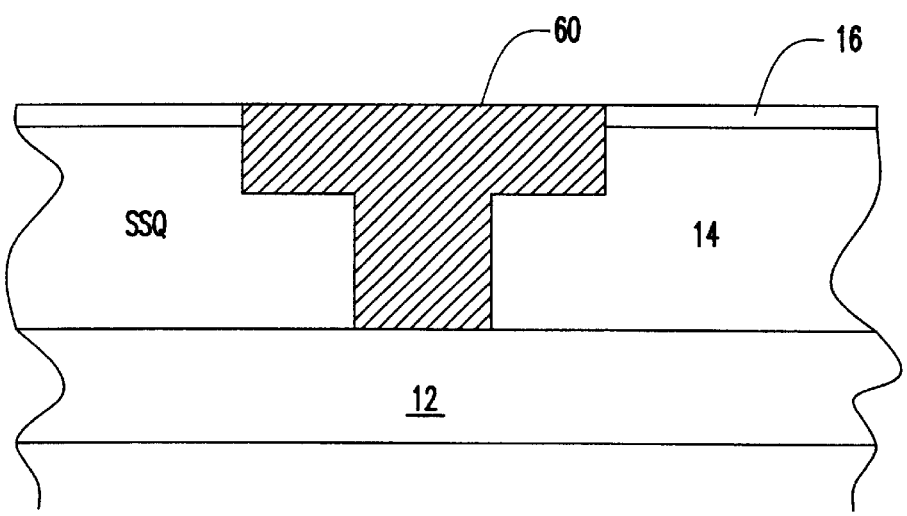
FIG. 6 is a cross-sectional view of the completed Damascene conductor and via in accordance with the invention.

As illustrated in FIG. 6, the via can then be anisotropically etched by any desired process to accurately form an opening to a desired structure on the chip without distortion as shown at 27 of FIG. 3, followed by stripping of the via resist. The via aspect ratio is determined, for any given transverse dimension of the via, solely by the SSQ layer thickness which can be readily controlled as desired. A blanket layer of metal will readily fill the via apertures as well as connection recesses 22, described above in connection with FIG. 2. The blanket metal layer may then be planarized by any known process to complete the connection and via structure 60 in accordance with the dual Damascene process. The planarization process can be halted at or carried through any portion of thin oxide layer 16 or the thin oxide layer can be removed entirely.

In view of the foregoing, it is seen that the invention provides a dual Damascene process and structure compatible with low dielectric constant SSQ dielectrics. The invention thus provides a structure and methodology by which robust conductors can be placed in increased proximity without increase of capacitive coupling, thus supporting increased integration density, speed of signal propagation and noise immunity. The process can be carried out and the structure formed without additional process steps beyond a process in which manufacturing yield would be greatly compromised and at reduced cost relative to processes which would have lower manufacturing yields and result in an inferior structure. Beyond the applications to flowable oxide materials and resist developer interactions discussed above, the method of the invention can be applied to provide a protective surface covering which is impervious to many or at least selected materials when no other form of protection is practically or economically available. The process in accordance with the invention can be repeated at will to form multiple dual Damascene layer constructions or to perform three or more separate patternings of a single layer or a combination thereof.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming a semiconductor device including steps of
    forming a pattern of resist on a surface of a material,
    removing a portion of said material in accordance with said pattern of resist while forming an intermediate material at an exposed surface of said material as said material is removed, said intermediate material being substantially impervious to a selected material,
    forming a further pattern of resist on a surface of said intermediate material, and
    removing a portion of said intermediate material and a further portion of said material in accordance with said further pattern of resist.

2. A method of forming a semiconductor device as recited in claim 1, wherein said step of removing a portion of said material includes resist stripping with an oxygen plasma.

3. A method of forming a semiconductor device as recited in claim 1, wherein said step of removing a portion of said material includes reactive ion etching with a fluorocarbon.

4. A method of forming a semiconductor device as recited in claim 1, wherein said material is a silsesquioxane material.

5. A method of forming a semiconductor device as recited in claim 4, wherein said step of removing a portion of said material includes resist stripping with an oxygen plasma.

6. A method of forming a semiconductor device as recited in claim 4, wherein said step of removing a portion of said material includes reactive ion etching with a fluorocarbon.

7. A method of forming a semiconductor device as recited in claim 1, wherein said material is a material selected from the group including hydrogen silsesquioxane and methyl silsesquioxane.

8. A method of forming a semiconductor device as recited in claim 5, wherein said step of removing the portion of said material includes resist stripping with an oxygen plasma.

9. A method of forming a semiconductor device as recited in claim 5, wherein said step of removing a portion of said material includes reactive ion etching with a fluorocarbon.

10. A semiconductor device formed by a process including steps of
    forming a pattern of resist on a surface of a material,
    removing a portion of said material in accordance with said pattern of resist while forming an intermediate material at an exposed surface of said material as said material is removed, said intermediate material being substantially impervious to a selected material,
    forming a further pattern of resist on a surface of said intermediate material, and
    removing a portion of said intermediate material and a further portion of said material in accordance with said further pattern of resist.

11. A semiconductor device formed by a process as recited in claim 10, wherein said step of removing a portion of said material includes resist stripping with an oxygen plasma.

12. A semiconductor device formed by a process as recited in claim 10 wherein said step of removing a portion of said material includes reactive ion etching with a fluorocarbon.

13. A semiconductor device formed by a process as recited in claim 10, wherein said material is a silsesquioxane material.

14. A semiconductor device formed by a process as recited in claim 13, wherein said step of removing a portion of said material includes resist stripping with an oxygen plasma.

15. A semiconductor device formed by a process as recited in claim 13, wherein said step of removing a portion of said material includes reactive ion etching with a fluorocarbon.

16. A semiconductor device formed by a process as recited in claim 13, wherein said flowable oxide material is a material selected from the group including hydrogen silsesquioxane and methyl silsesquioxane.

17. A semiconductor device formed by a process as recited in claim 14, wherein said step of removing a portion of said material includes resist stripping with an oxygen plasma.

18. A semiconductor device formed by a process as recited in claim 14, wherein said step of removing a portion of said material includes reactive ion etching with a fluorocarbon.

* * * * *